(12) United States Patent  
Xie et al.

(10) Patent No.: US 6,710,444 B2  
(45) Date of Patent: Mar. 23, 2004

(54) MOLDED SUBSTRATE STIFFENER WITH EMBEDDED CAPACITORS

(75) Inventors: Hong Xie, Phoenix, AZ (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/101,739

(22) Filed: Mar. 21, 2002

(65) Prior Publication Data

US 2003/0178722 A1 Sep. 25, 2003

(51) Int. Cl.$^7$ ............................................. H01L 23/34
(52) U.S. Cl. .................. 257/723; 257/724; 257/779; 257/772
(58) Field of Search ................................ 257/723, 724, 257/779, 772

(56) References Cited

U.S. PATENT DOCUMENTS

| | | | | |
|---|---|---|---|---|
| 6,091,194 A | * | 7/2000 | Swirbel et al. | 313/498 |
| 6,346,743 B1 | * | 2/2002 | Figueroa et al. | 257/723 |
| 6,512,182 B2 | * | 1/2003 | Takeuchi et al. | 174/256 |
| 2002/0033378 A1 | * | 3/2002 | Hayashi et al. | 216/11 |

* cited by examiner

*Primary Examiner*—Luan Thai  
(74) *Attorney, Agent, or Firm*—Pillsbury Winthrop LLP

(57) ABSTRACT

A molded stiffener for a package substrate is presented. The stiffener includes a molded portion. The molded portion is molded of an electrically nonconductive molding compound. A plurality of capacitors are embedded in the molded portion. The capacitors are constructed and arranged to be electrically connected to the package substrate. As such, power delivery performance is improved, and mechanical strength is added to the substrate.

16 Claims, 3 Drawing Sheets

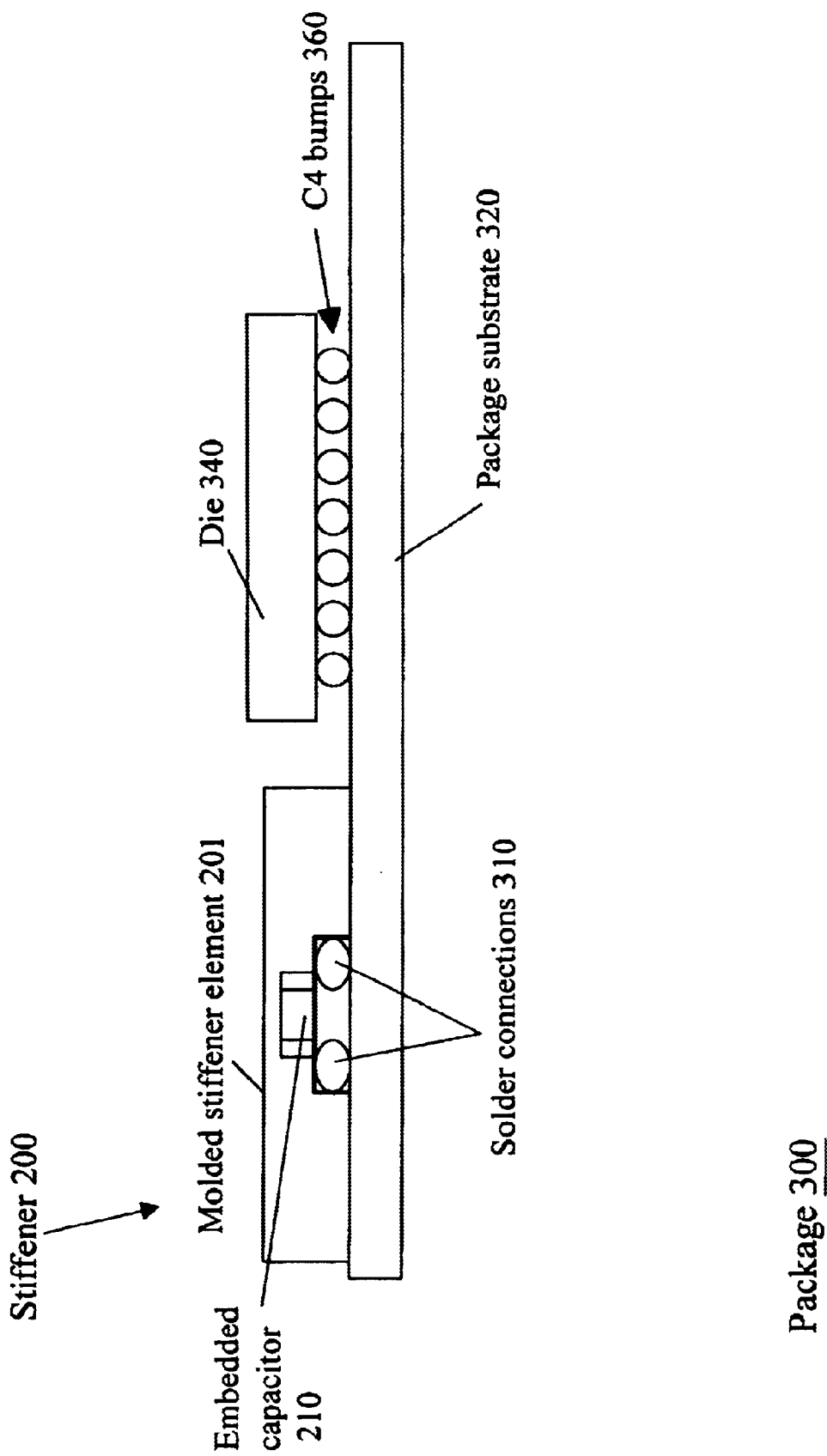

MOLDED SUBSTRATE STIFFENER WITH EMBEDDED CAPACITORS

BACKGROUND

1. Field

This invention relates generally to packaging of integrated circuits. More specifically, this invention relates to a stiffener for a package substrate.

2. Backgrounds and Related Art

In recent years, substrates have become increasingly fragile. In particular, thin core and coreless substrates have emerged. Such substrates improve the electrical performance of a package by reducing the lengths and distances of circuit paths and electrical connections. Substrates are typically handled during the assembly and test manufacturing process and when changes, such as chip upgrades, are made to existing systems. To enable a package to survive such handling, as well as other stresses in the use environment of the package, stiffeners often are attached to substrates.

FIG. 1 (Prior Art) illustrates a portion of an electronic package 100. Package 100 includes a package substrate 130, pins 140 attached to substrate 130, land side capacitor (LSC) 120, a die 110, and metal stiffeners 101. Each metal stiffener 101 typically comprises a metal piece, such as a rectangular or circular frame, that is glued to substrate 130. Metals such as copper may be employed for stiffeners 101. Each metal stiffener 101 has a cutout in the middle thereof to enable die 110 to pass through the frame of each metal stiffener 101.

Substrate 130 may comprise a thin core or coreless substrate. Substrate 130 may be handled by grasping metal stiffener 101 and without grasping substrate 130. Accordingly, metal stiffeners 101 provide mechanical stability to substrate 130 by reducing the forces applied to substrate 130 during handling of substrate 130.

Power delivery requirements of integrated circuits are becoming increasingly demanding. For instance, in packages that include central processing unit (CPU) elements, large amounts of electrical energy are needed to initially power a CPU that has been idle. The required change in current per unit time (di/dt) associated with ramping of the current may be very high. As such, increased amounts of capacitance are typically included in a package to store energy for the ramping. Yet, a typical package has a limited amount of space in which to house capacitive elements. Such limited space may constrain power delivery performance of the package.

Therefore, what is needed is a stiffener that provides enhanced benefits to a package substrate.

BRIEF DESCRIPTION OF THE DRAWINGS

FIG. 3 is a side view of portions of an electronic package according to an embodiment of the present invention.

DETAILED DESCRIPTION

A stiffener for a package substrate, as presented herein, includes a molded portion. The molded portion is molded of an electrically nonconductive molding compound. A plurality of capacitors are embedded in the molded portion. The capacitors are constructed and arranged to be electrically connected to the package substrate. Accordingly, enhanced power delivery performance and enhanced stability are provided to an electronic package.

Figure 1:
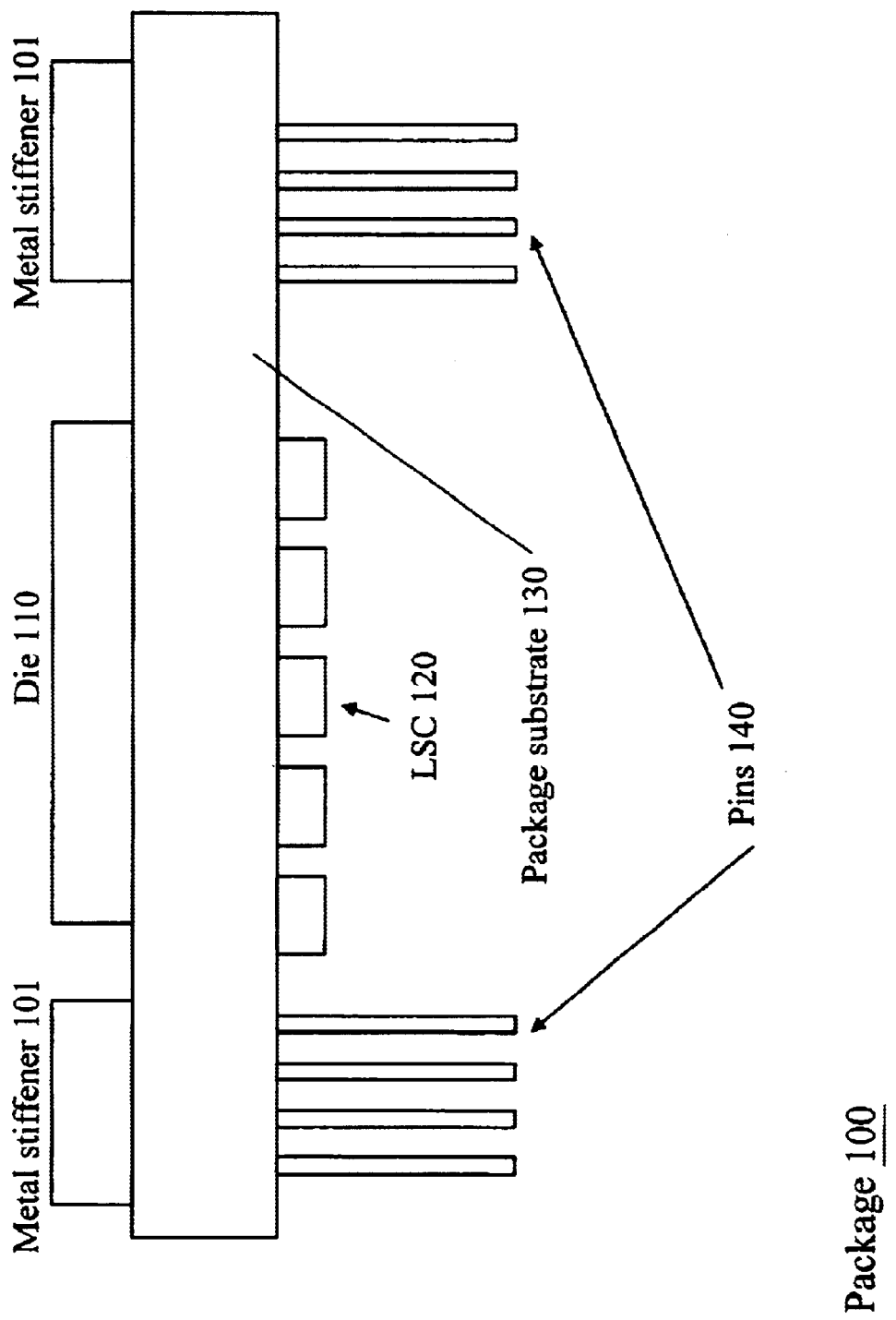
FIG. 1 (Prior Art) is a side view of portions of an electronic package that includes metal stiffeners.
Figure 2:
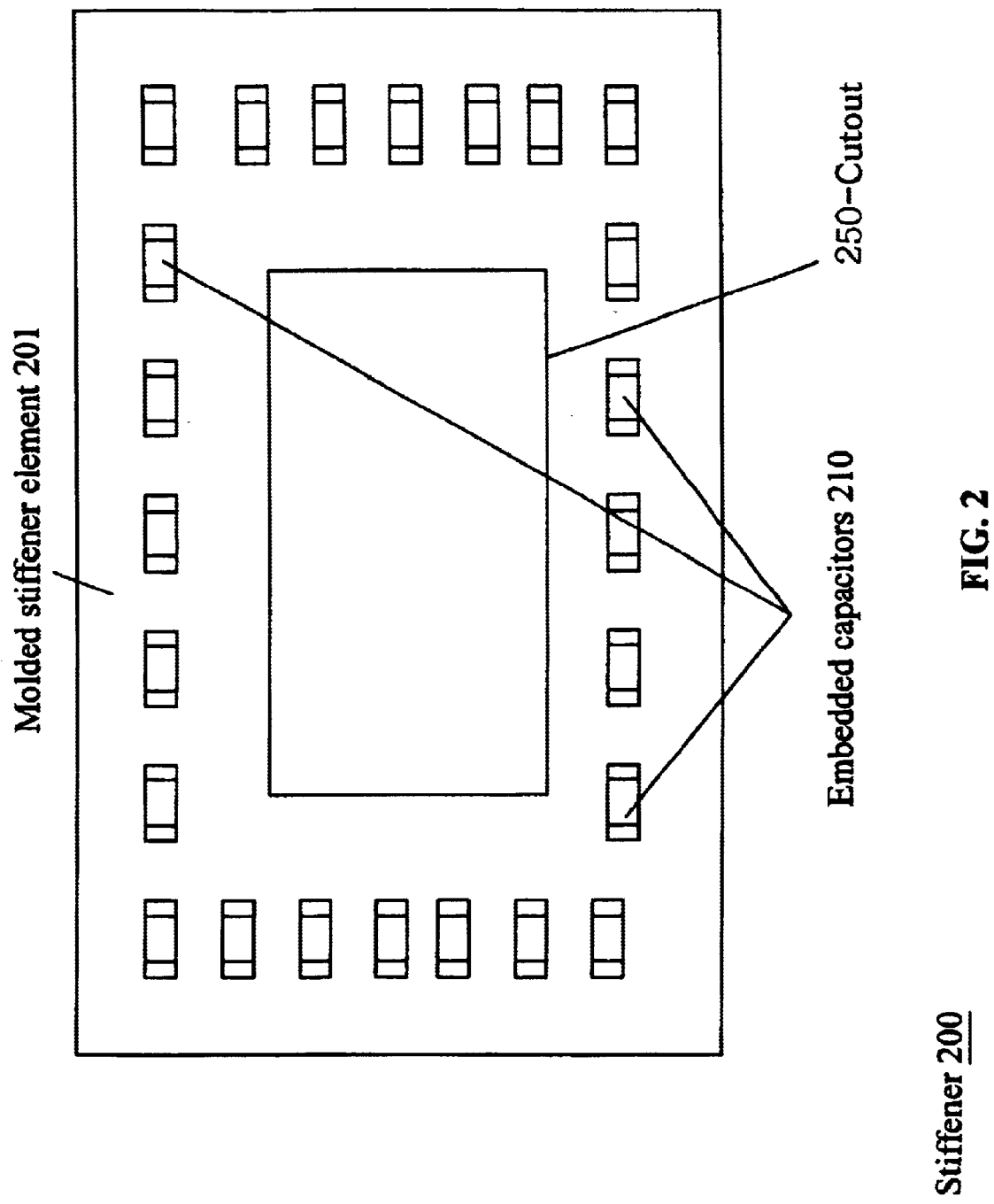
FIG. 2 is a top view of a molded stiffener with embedded capacitors according to an embodiment of the present invention.

FIG. 2 is a top view of a molded stiffener 200 with embedded capacitors according to an embodiment of the present invention. As shown, stiffener 200 includes a molded stiffener element 201 and capacitors 210 embedded inside stiffener element 201. The molded stiffener element 201 may include a cutout 250 as illustrated in FIG. 2.

Stiffener element 201 may be molded of various materials, such as polymers that can be cured. In an exemplary implementation, stiffener element 201 is molded of an electrically nonconductive molding compound, such as epoxy or other thermosetting resins. Appropriate molding compound/capacitor combinations may be selected by artisans of ordinary skill based in part on the respective coefficient of thermal expansion (CTE) of the molding compound and embedded capacitors 210. CTE mismatch may adversely affect overall system performance.

Stiffener element 201 may be molded into various shapes and geometries in order to accommodate associated configurations of substrates, dies, and other package components. In some embodiments, stiffener element 201 may be attached to a package substrate, such as a thin core or coreless substrate. For instance, epoxy or another adhesive material may be employed to glue stiffener element 201 to the substrate. However, connections of capacitors 210 to a package substrate may lend sufficient stability to the package substrate. Thus, mechanical attachments of stiffener element 201 to a package substrate may not be necessary in some embodiments.

FIG. 3 is a side view of portions of a package 300 according to an embodiment of the present invention. Package 300 includes molded stiffener elements 201, embedded capacitors 210, a die 340, and a package substrate 320. Die 340 may comprise a silicon die and may be electrically connected to package substrate 320 in accordance with the art. For instance, die 340 may be connected to package substrate 320 via C4 (controlled collapsed chip connection) bumps 360.

FIG. 3 illustrates one of the capacitors 210 embedded in a stiffener element 201. Capacitor 210, which may comprise a ceramic capacitor, for example, may be electrically connected to a package substrate 320. In particular, side terminals of each capacitor 210 may be attached via soldered leads to corresponding pads on package substrate 320. Such solder connections 310 may lend mechanical strength to stiffener element 201 and to package substrate 320. It is to be appreciated that, in some cases, a capacitor may be stronger than a molding compound employed to form stiffener element 201.

Each pad on package substrate 320 to which side terminals of a capacitor are attached may, in turn, be electrically connected to a power plane (not shown) or a ground plane (not shown) of package 300. As such, pads may have positive or negative polarity. Thus, the capacitance of capacitors 210 embedded in stiffener element 201 may be exploited by an integrated circuit included within package 300. Specifically, in an exemplary implementation, capacitors 210 may store at least a portion of the charge necessary to support ramping of current for a CPU that has been idle. Therefore, embodiments of the present invention may achieve improved power delivery performance.

Stiffener 200 may be manufactured according to various methods. For instance, in the case of a stiffener having a rectangular frame, such as that shown in FIG. 2, a rectangular mold fixture with pockets to receive capacitors may be utilized. Capacitors may be inserted into the pockets. A molding compound at high temperature may be poured into the mold fixture. As it is cooled, the molding compound can be cured to form a relatively rigid material. The resulting molded stiffener may then be removed from the fixture and attached to a substrate.

A stiffener such as stiffener 200 may be attached to a substrate by a supplier of substrates before the supplier ships the substrate to a purchasing company. Alternatively, a stiffener may be attached to the substrate by the purchasing company.

The foregoing description of the preferred embodiments is provided to enable any person skilled in the art to make or use the present invention. Various modifications to these embodiments are possible, and the generic principles presented herein may be applied to other embodiments as well. For instance, a stiffener element may take on any moldable shape, such as rectangular, circular, trapezoidal, or irregular.

As such, the present invention is not intended to be limited to the embodiments shown above but rather is to be accorded the widest scope consistent with the principles and novel features disclosed in any fashion herein.

What is claimed is:

1. An electronic package, comprising:
   a package substrate;
   a stiffener including a molded portion coupled to the package substrate to provide stability to the package substrate, the molded portion being formed of an electrically nonconductive molding compound; and
   a plurality of capacitors embedded in the molded portion and arranged to be electrically connected to the package substrate, wherein the molded portion is constructed and arranged to be attached to the package substrate and the molded portion is attached to the package substrate via an adhesive material.

2. The electronic package of claim 1, wherein side terminals of each among the plurality of capacitors are constructed and arranged to be solder-attached to corresponding pads on the package substrate.

3. The electronic package of claim 2, wherein a pad on the package substrate is constructed and arranged to be electrically connected to one of a power plane and a ground plane of the electronic package.

4. The electronic package of claim 1, wherein the package substrate is thin core or coreless.

5. An electronic package, comprising:
   a package substrate;
   a molded portion molded of an electrically nonconductive molding compound; and
   a plurality of capacitors embedded in the molded portion and constructed and arranged to be electrically connected to the package substrate,
   wherein the molded portion is substantially rectangular in shape and has a cutout in a face thereof.

6. The electronic package of claim 5, wherein side terminals of each among the plurality of capacitors are constructed and arranged to be solder-attached to corresponding pads on the package substrate.

7. The electronic package of claim 6, wherein a pad on the package substrate is constructed and arranged to be electrically connected to one of a power plane and a ground plane of the electronic package.

8. The electronic package of claim 5, wherein the package substrate is thin core or coreless.

9. A stiffener for providing stability to a package substrate, comprising:
   a molded portion, coupled to the package substrate, formed of an electrically nonconductive molding compound; and
   a plurality of capacitors embedded in the molded portion end arranged to be electrically connected to the package substrate, wherein the molded portion is constructed and arranged to be attached to the package substrate and the molded portion is attached to the package substrate via an adhesive material.

10. The stiffener of claim 9, wherein the molding compound comprises a polymer.

11. The stiffener of claim 9, wherein the molding compound comprises an epoxy.

12. The stiffener of claim 9, wherein at least one among the plurality of capacitors comprises a ceramic capacitor.

13. A stiffener for a package substrate, comprising:
    a molded portion molded of an electrically nonconductive molding compound; and
    a plurality of capacitors embedded in the molded portion and constructed and arranged to be electrically connected to the package substrate, wherein the molded portion is substantially rectangular and has a cutout in a face thereof.

14. The stiffener of claim 13, wherein the molding compound comprises a polymer.

15. The stiffener of claim 13, wherein the molding compound comprises an epoxy.

16. The stiffener of claim 13, wherein at least one among the plurality of capacitors comprises a ceramic capacitor.

* * * * *